(12) United States Patent
Nguyen et al.

(10) Patent No.: US 11,942,426 B2
(45) Date of Patent: Mar. 26, 2024

(54) SEMICONDUCTOR STRUCTURE HAVING ALTERNATING SELECTIVE METAL AND DIELECTRIC LAYERS

(71) Applicant: INTERNATIONAL BUSINESS MACHINES CORPORATION, Armonk, NY (US)

(72) Inventors: Son Nguyen, Schenectady, NY (US); Takeshi Nogami, Schenectady, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 17/302,549

(22) Filed: May 6, 2021

(65) Prior Publication Data

US 2022/0359390 A1    Nov. 10, 2022

(51) Int. Cl.
  *H01L 23/528*   (2006.01)
  *H01L 21/02*    (2006.01)
  (Continued)

(52) U.S. Cl.
  CPC ...... *H01L 23/5283* (2013.01); *H01L 21/0228* (2013.01); *H01L 21/28562* (2013.01); *H01L 21/76801* (2013.01); *H01L 21/76832* (2013.01); *H01L 21/76879* (2013.01); *H01L 21/76897* (2013.01); *H01L 21/76804* (2013.01)

(58) Field of Classification Search
  CPC .......... H01L 23/5283; H01L 21/76897; H01L 21/76816; H01L 21/76832; H01L 21/76879; H01L 21/0228; H01L 21/28562; H01L 21/823475; H01L 21/76837;
  (Continued)

(56) References Cited

U.S. PATENT DOCUMENTS 7,524,735 B1    4/2009  Gauri
8,232,607 B2    7/2012  Edge
(Continued)

FOREIGN PATENT DOCUMENTS

CN      106164332 A    11/2016
WO      2022233217 A1  11/2022

OTHER PUBLICATIONS

Notification of Transmittal of the International Search Report and the Written Opinion of the International Searching Authority, or the Declaration, dated Jun. 16, 2022, Applicant's or agent's file reference IEE220304PCT, International application No. PCT/CN202/085869, 9 pages.

(Continued)

*Primary Examiner* — Younes Boulghassoul
(74) *Attorney, Agent, or Firm* — L. Jeffrey Kelly

(57) ABSTRACT

A semiconductor structure including a first dielectric layer comprising a first conductive metal feature embedded in the first dielectric layer; and a second dielectric layer including a second conductive metal feature embedded in the second dielectric layer, the second conductive metal feature is above and directly contacts the first conductive metal feature, and an interface between the second conductive metal feature and the second dielectric layer includes a repeating scallop shape along its entire length.

19 Claims, 9 Drawing Sheets

(51) Int. Cl.
*H01L 21/285* (2006.01)
*H01L 21/768* (2006.01)

(58) Field of Classification Search
CPC ......... H01L 21/76838; H01L 21/76801; H01L 23/5238; H01L 23/53295; H01L 21/28506
See application file for complete search history.

(56) References Cited

U.S. PATENT DOCUMENTS

| | | | |
|---|---|---|---|
| 8,357,608 | B2 | 1/2013 | Gates |
| 8,779,600 | B2 | 7/2014 | Nguyen |
| 9,312,224 | B1 | 4/2016 | Canaperi |
| 9,349,687 | B1 | 5/2016 | Gates |
| 9,583,389 | B2 | 2/2017 | Romero |
| 9,711,456 | B2 | 7/2017 | Canaperi |
| 9,777,025 | B2 | 10/2017 | Girard |
| 10,047,435 | B2 | 8/2018 | Haukka |
| 10,340,135 | B2 | 7/2019 | Blanquart |
| 10,395,986 | B1 | 8/2019 | Briggs |
| 10,428,421 | B2 | 10/2019 | Haukka |
| 10,580,644 | B2 | 3/2020 | Tapily |
| 2013/0234336 | A1* | 9/2013 | Richter ............. H01L 23/53295 257/E21.586 |
| 2015/0170961 | A1* | 6/2015 | Romero ............ H01L 21/28506 438/641 |
| 2015/0299848 | A1 | 10/2015 | Haukka |
| 2017/0037513 | A1 | 2/2017 | Haukka |
| 2017/0179034 | A1 | 6/2017 | Canaperi |
| 2018/0012752 | A1 | 1/2018 | Tapily |
| 2019/0027406 | A1 | 1/2019 | Chu |
| 2019/0157076 | A1* | 5/2019 | Hausmann ............... C23C 16/04 |
| 2020/0020580 | A1* | 1/2020 | Lee ..................... H01L 21/0228 |
| 2020/0105591 | A1* | 4/2020 | Lin ................... H01L 21/76801 |
| 2020/0135893 | A1 | 4/2020 | Bi |
| 2020/0173953 | A1 | 6/2020 | Camagong |
| 2021/0184018 | A1* | 6/2021 | Khaderbad ......... H01L 29/7851 |

OTHER PUBLICATIONS

Briggs et al., "Process Challenges in Fully Aligned Via Integration for sub 32 nm Pitch BEOL", © 2018 IEEE, 1 page.
Grill et al., "Progress in the development and understanding of advanced low k and ultralow k dielectrics for very large-scale integrated interconnects-State of the art", Applied Physics Reviews, Published online Jan. 15, 2014, pp. 1, 011306-1-011306-17.
Kim et al., "A Process for Topographically Selective Deposition on 3D Nanostructures by Ion Implantation", © 2016 American Chemical Society, ACS Nano 2016, 10, pp. 4451-4458.
Mackus, "Approaches and challenges for self-aligned fabrication by area-selective atomic layer deposition", 2019 IITC MAM Program—International Interconnect Technology Conference, 2 pages.
Nguyen et al., "Advanced ultrathin nano layers selective Cobalt and conformal SiN caps for sub-20 nm Copper/Low k Interconnects", Applied Materials Electronic Technology Conference on Selective Deposition and Removal of Materials, Monterey, California, USA, Jun. 4-6, 2013, 1 page.
Yang et al., "Selective Chemical Vapor Deposition-Grown Ru for Cu Interconnect Capping Applications", Electrochemical and Solid-State Letters, 13, (5) D33-D35, 2010.
Parsons et al., "Area-Selective Deposition: Fundamentals, Applications, and Future Outlook", Chemistry of Materials, 2020, 32, 12, 4920-4953.
Pasquali et al., "Downscaling area-selective deposition to sub-30 nm half-pitch lines", 2019 IITC MAM Program—International Interconnect Technology Conference, 5 pages.
Nguyen, "Selective CVD Metal Deposition for nano device in semiconductor fabrication", Jun. 4, 2018, 2018 IITC Program—International Interconnect Technology Conference, Part 1, 20 pages.
Nguyen, "Selective CVD Metal Deposition for nano device in semiconductor fabrication", Jun. 4, 2018, 2018 IITC Program—International Interconnect Technology Conference, Part 2, 20 pages.
Nguyen, "Selective CVD Metal Deposition for nano device in semiconductor fabrication", Jun. 4, 2018, 2018 IITC Program—International Interconnect Technology Conference, Part 3, 20 pages.
Nguyen, "Selective CVD Metal Deposition for nano device in semiconductor fabrication", Jun. 4, 2018, 2018 IITC Program—International Interconnect Technology Conference, Part 4, 11 pages.

* cited by examiner

SECTION A

SECTION A

SECTION A

SECTION A

SECTION A

SECTION A

SECTION A

SECTION A

SEMICONDUCTOR STRUCTURE HAVING ALTERNATING SELECTIVE METAL AND DIELECTRIC LAYERS

BACKGROUND

The present invention relates, generally, to the field of semiconductor manufacturing, and more particularly to alternating cyclic deposition of selective metals and dielectrics.

SUMMARY

According to an embodiment of the present invention, a semiconductor structure including a first dielectric layer including a first conductive metal feature embedded in the first dielectric layer; and a second dielectric layer including a second conductive metal feature embedded in the second dielectric layer, the second conductive metal feature is above and directly contacts the first conductive metal feature, and an interface between the second conductive metal feature and the second dielectric layer includes a repeating scallop shape along its entire length.

According to another embodiment, a semiconductor structure including a metal nanostructure embedded in a dielectric layer, where a boundary between the conductive metal feature and the dielectric layer include a repeating scallop shape along its entire length.

According to another embodiment, a semiconductor structure including a conductive nanostructure embedded in a dielectric layer, where an interface between the conductive metal feature and the dielectric layer comprises a repeating scallop pattern along its entire length such that scalloped portions of the dielectric layer partially overlap scalloped portions of the metal material of the conductive nanostructure.

BRIEF DESCRIPTION OF THE DRAWINGS

The following detailed description, given by way of example and not intended to limit the invention solely thereto, will best be appreciated in conjunction with the accompanying drawings, in which.

Figure 1:
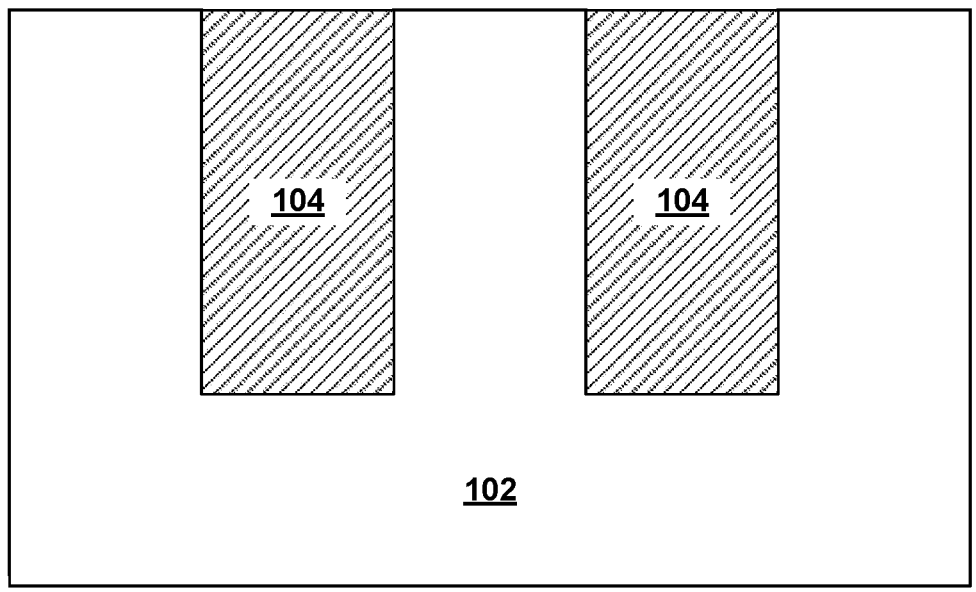
FIG. 1 is a cross-sectional view of a semiconductor structure according to an exemplary embodiment.

Elements of the figures are not necessarily to scale and are not intended to portray specific parameters of the invention, except where specifically reference and noted. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

To date, scaling integrated circuit features has motivated innovation in an ever-growing semiconductor industry. Smaller features enable increased device density allowing manufacturing of products with increased capacity. To keep with scaling, the sizes and the spacing of the integrated circuit features has decreased over time, and that trend is expected to continue.

With the 7 nm technology node in the development phase and the 5 nm node moving into development, transistor scaling gets ever more complex. In addition, performance benefits gained at the front-end-of-line, for example semiconductor devices such as transistors, can easily be compromised if similar improvements are not made in the back-end-of-the-line. Back-end-of-the-line processing involves the creation of stacked layers of conductive structures, such as for example metal wires and vias, which form the necessary electrical connections between various microelectronic devices, such as for example, transistors.

With each technology node, the metal wiring scheme becomes more complex, mainly because there are more transistors to connect thus requiring an ever-tighter pitch. Tighter pitches and shrinking dimensions in the front-end-of-line require smaller wires in the back-end-of-line, and smaller wires results in higher resistance-capacitance product (RC) of the interconnect system.

The conductive structures are typically formed using lithographic techniques; however, current lithographic techniques have known limitations and drawbacks, especially when feature sizes are 20 nm or less. Selective deposition techniques may be used to overcome some of the known deficiencies of conventional lithographic techniques; however, they too have drawbacks. Typically, dielectric materials are selectively deposited on dielectric materials and metals are selectively deposited on metals to form various features, for example conductive structures, as an alternative to forming the features lithographically. Depositing materials in such a fashion is known to produce "mushroom shaped" films that, when deposited sequentially, laterally increase in size. For example, each selectively deposited film is wider than the previous.

Therefore, additional steps must be taken to control lateral growth of a feature formed using selective deposition. Known techniques used to control lateral growth of selectively deposited films include some form of blocking or intermediate etching. Blocking or preventing lateral growth of each layer will allow for good control of the lateral shape and size of the resulting feature; however, extra steps are required to prepare the blocking structure. In such cases, the blocking structure may include using known masking and patterning techniques. Alternatively, intermediate etching may be used to trim or etch each layer immediately after deposition. Although subsequently deposited layers will increase in width, intermediate etching each layer between successive depositions can be used to trim the width of each layer to a predetermined width resulting in a desired feature shape and size. Unfortunately, blocking, and intermediate etching come with their own challenges. In addition to requiring extras processing steps, both blocking or intermediate etching can suffer from misalignment which can be exacerbated in small feature sizes and tight pitches.

The alternating cyclic deposition techniques described herein enable the building of robust nano interconnect structures and devices with optimal electronic performance and device reliability. For example, the alternating cyclic deposition techniques described herein enable (a) robust fully aligned via structure with control thickness; (b) etch stop diffusion/oxidation barriers; (c) increased dielectric Emax/Vmax electrical breakdown/leakage; and (d) nanostructures with reduced resistance-capacitance. For purposes of the present invention, nanostructures are defined as any semiconductor structure having sublithographic dimensions. While a "lithographic minimum dimension" and a "sublithographic dimension" are defined only in relation to a lithography tool and normally change from generation to generation of semiconductor technology, it is understood that the lithographic minimum dimension and the sublithographic dimension are to be defined in relation to the best performance of lithography tools available at the time of semiconductor manufacturing. As of 2021, the lithographic minimum dimension is about 50 nm and is expected to shrink in the future.

In accordance with embodiments of the present invention, metals are deposited selective to dielectric and dielectrics are deposited selective to metals. Stated differently, metals are deposited on metals and dielectrics are deposited on dielectrics. For example, known CVD or ALD techniques may be used to selectively deposit metals, such as, for example, Co, Ru, Mn, W, Pt, or, CoWP. Similarly, known CVD or ALD techniques may be used to selectively deposit dielectrics, such as, for example, $SiO_2$, $AlO_x$, $ZnO$, $HfO_x$, SiN, or SiCOH.

Furthermore, the dielectrics and metals may be chosen based on the underlying material on which they are being deposited. Subsequent layers may be the same or different from the underlying material on which they are being deposited. Materials are carefully selected to optimize properties of the final structure.

For example, dielectrics may be selected to optimize oxidation/metal diffusion barriers (SiCN, $AlO_x\_SiCO$), Emax (C-rich SiCN, $SiO_x$), Vmax (C-Rich SiCN, Bilayer, electrical breakdown/leakage for nano device performance, or dielectric with storage memory/AI capability like $HfO_x$ and ferro-dielectrics can be used as memory cell device with subsequent integration. For example, some embodiments may use low k (k~3.3) C-rich SiCN for the first and final layers of the multilayer dielectric stack to enhance time-dependent dielectric breakdown (hereinafter "TDDB") reliability due to lower Plasma Induce damage and better oxidation and diffusion properties. Selective metal layers also can be modified to improve the metal film's stack properties.

Additionally, for example, different metal such as Ti can be used beneath or above Co layer to improve contact resistance, or selective Ru or W metal on top Co to enhance the oxidation resistance. According to yet another example, alternate layers of Ru/Co can improve both oxidation resistance and line resistance. In yet another example, insertion of Ru or Mn nano layer on top of Co/Cu layers will improve EM reliability due to stronger bonding between metal interfaces and oxygen gettering properties of Mn that form MnOx. The multilayer metal with robust in-situ metal capping on top and bottom will enhance both contact resistance and EM reliability. According to another example, Co and Mn on top and bottom of Cu, or Co/Ti on top and bottom of Ru metal may be used to achieve similar advantages as described above.

The present invention relates, generally, to the field of semiconductor manufacturing, and more particularly to alternating cyclic deposition of thin films. More specifically, selectively depositing thin layers of dielectric material and metal in an alternating fashion, one after another, can be used to uniquely control lateral growth of such thin films. Using selective deposition techniques eliminates the need for blocking or intermediate etching and improves dimensional control of the final feature/structure. One embodiment by which to selectively deposit thin layers of dielectric materials and metals in an alternating fashion is described in detail below by referring to the accompanying drawings in FIGS. 1 to 9. Those skilled in the art will readily appreciate that the detailed description given herein with respect to these figures is for explanatory purposes as the invention extends beyond these limited embodiments.

The alternating cyclic deposition techniques described herein may be used to fabricate various structures with improved dimensional control thereby improving higher performance and enhanced reliability. For example, the alternating cyclic deposition techniques described herein may be used to form conductive structures such as, for example, full aligned via structures, contact structures or robust metal lines. The cyclic deposition techniques described herein allows for precise control of thickness and lateral growth further enabling improved device performance. The precise control further enables fabrication of nanostructures which are better aligned with underlying structures thereby reducing dielectric spacing between adjacent structures. As mentioned above, forming conductive structures using the cyclic deposition techniques described herein can minimize contact and line resistance and further enable advanced conductive nanostructures. Furthermore, robust advanced nano metal interconnect structures may be fabricated using low k dielectrics (flowable CVD SiCOH 2.7) gap fill with no plasma damage.

Advantageously, selectively depositing metal and dielectric thin films in an alternating fashion can be implemented in the back-end-of-line, and is compatible with current process flows. The back-end-of-line may be distinguished from front-end-of-line in that semiconductor devices, for example transistors, may typically fabricated in the front-end-of-line while the connections to and between those semiconductor devices are typically formed in the back-end-of-line.

Referring now to FIG. 1, a structure 100 is shown. The structure 100 may include a dielectric layer 102 and metal regions 104. The dielectric layer 102 and metal regions 104 represent a single exemplary metallization layer or level in the back-end-of-line or middle-of-line of a semiconductor structure. The metallization layer illustrated in FIG. 1 may represent any interconnect level in a semiconductor structure.

The dielectric layer 102 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Alternatively, the dielectric layer 102 may include ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Known suitable deposition techniques, such as, for example, atomic layer deposition, chemical vapor deposition, plasma enhanced chemical vapor deposition, spin on deposition, or physical vapor deposition may be used to form the dielectric layer 102. The dielectric layer 102 may have a typical thickness ranging from about 100 nm to about 150 nm and ranges there between, although a thickness less than 100 nm and greater than 150 nm may be acceptable. It should be noted that while only a single interconnect level is shown, the structure 100 will have multiple interconnect levels either above and/or below the level shown.

The metal regions 104 are formed in the dielectric layer 102 in accordance with known techniques. In an embodiment, the metal regions 104 include a typical conductive feature, such as, for example, a line or a wire typically found in the back-end-of-line. In a different embodiment, the metal regions 104 include metal contact regions, or other metallic interconnect structures.

The metal regions 104 may be substantially similar structures and may be fabricated using, for example, a typical single or dual damascene technique in which a conductive interconnect material may be deposited in a trench formed in the dielectric layer 102. Alternatively, known subtractive techniques may also be used to form the metal regions 104. In some embodiments, the metal regions 104 are formed using known selective deposition techniques. It should be noted that while only two metal regions 104 are shown, the structure 100 may have any number of metal regions disposed in any number of metallization levels.

The metal regions 104 can be made from any conductive materials known in the art, such as, for example, copper (Cu), aluminum (Al), or tungsten (W). In an embodiment, the metal regions 104 can be copper (Cu) and can include a metal liner (not shown), where the metal liner can include one or more conformal metal layers, such as, for example, tantalum nitride and tantalum (TaN/Ta), titanium, titanium nitride, cobalt, ruthenium, and manganese.

Figure 2:
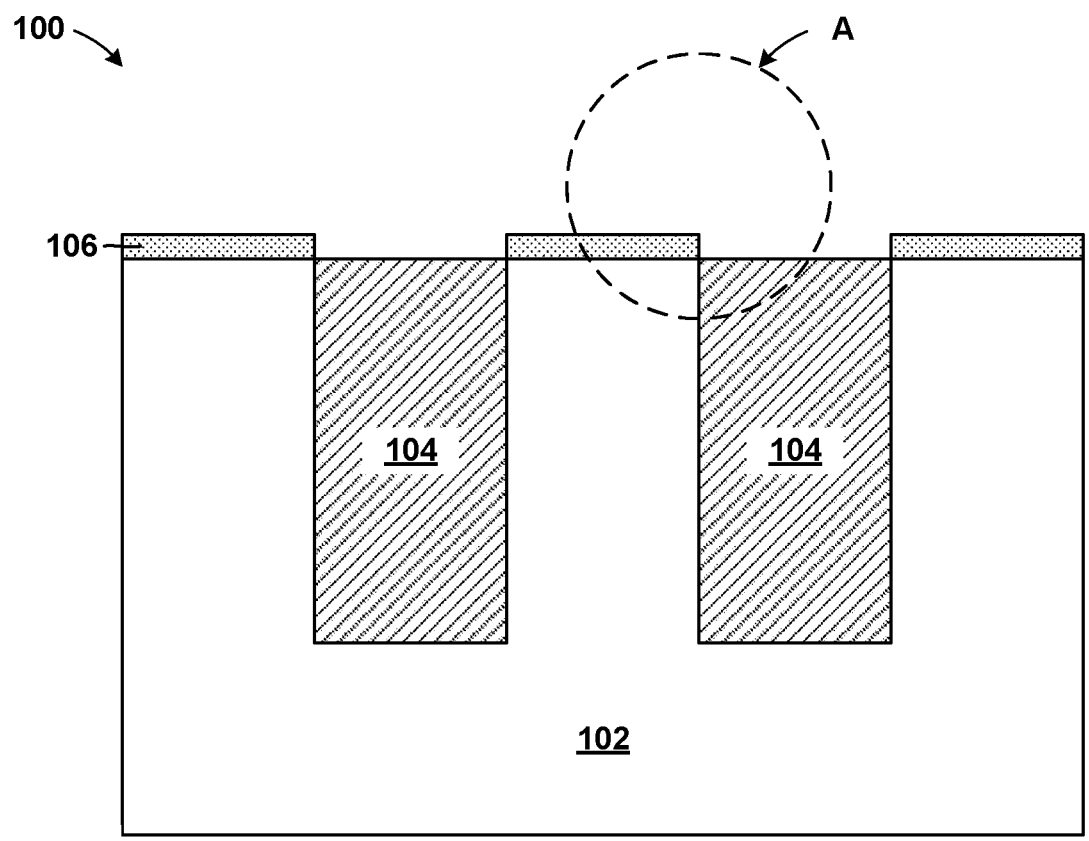
FIG. 2 is a cross-sectional view of the semiconductor structure illustrating after depositing a first dielectric layer according to an exemplary embodiment.
Figure 2A:
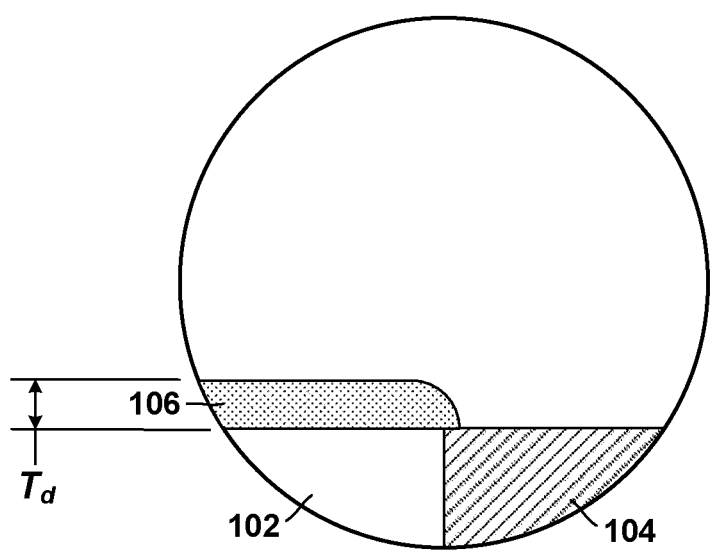
FIG. 2A depicts a section view, section A, of FIG. 2.

Referring to FIGS. 2 and 2A, a first dielectric layer 106 is selectively deposited on an upper surface of the dielectric layer 102. FIG. 2A is a section view, section A, of FIG. 2. The details shown FIG. 2A, and subsequent section views, are provided for illustrative purposes only and are not necessarily drawn to scale.

As described herein, selective deposition refers to a material being selectively deposited on surface A and not on surface B. The ability to selectively deposit semiconductor materials has enabled new integration and patterning schemes all while decreasing the number of manufacturing operations otherwise associated with conventional semiconductor manufacturing processes, as described above. Embodiments of the present invention apply the principles of selective deposition, but in a manner that addresses its deficiencies noted above.

In general, the first dielectric layer 106 is selectively deposited on the upper surface of the dielectric layer 102 without being deposited on adjacent surfaces of the metal regions 104 according to known techniques. As such, the first dielectric layer 106 will generally be self-aligned with the underlying dielectric layer 102; however, some lateral growth or lateral overlap is expected. In such cases, the first dielectric layer 106 will extend laterally beyond the interface between the dielectric layer 102 and the metal regions 104. Otherwise, a small portion of the first dielectric layer 106 will form on top of the metal regions 104 as generally shown in FIG. 2A. As noted above, such lateral overlap is generally undesirable and additional measures must be taken to control the lateral width of layers formed using selective deposition techniques.

It is further noted, selectively depositing the first dielectric layer 106 will produce a rounded edge or scalloped shape at the outermost edge of the first dielectric layer 106, as shown in the figures. In all cases, the exact shape and size of the scalloped shape will depend on the chosen selective deposition technique and individual layer thickness. For example, layers deposited with a smaller thickness will generally have a smaller scalloped shape and less overlap. A primary objective of using the techniques described herein is to optimize fabrication of nanostructures. Therefore, thinner layers are used to precisely control the shape and location of the final structure. In general, thinner layers will produce more uniform features with less irregularities. Specifically, thinner layers will result in less overlap and smaller scallop shapes thereby producing a relatively uniform interface between the dielectrics and the metals. In contrast, thicker layers will result in more overlap and larger scallop shapes thereby producing a relatively non-uniform interface between the dielectrics and the metals.

According to embodiments of the present invention, the first dielectric layer 106, are deposited in very thin films. For example, for nano structures having critical dimensions less than 20 nm, it is critical the first dielectric layer 106 be deposited with a thickness ($T_d$) less than 40 angstroms, and more preferably less than 30 angstroms, in order to limit the lateral overlap and fully appreciate the advantages of the present invention. The amount the first dielectric layer 106 that will extend laterally beyond the interface between the dielectric layer 102 and the metal regions 104 decreases as the thickness of the first dielectric layer 106 decreases. If the lateral growth is greater than 2 nm then the advantages and effectiveness of the alternating cyclic deposition techniques described herein become diminished. For example, lateral overlap greater than about 2 nm will result in conductive nanostructures having poor dielectric Emax/Vmax electrical breakdown performance and increased resistance-capacitance.

Selectively depositing a thinner first dielectric layer (106) will limit or reduce how much the first dielectric layer 106 overlaps the metal regions 104. For example, the first dielectric layer 106 deposited at about 20-30 angstroms will laterally overlap the metal regions 104 by about 2 nm or less. As previously described above, the alternating cyclic deposition techniques described herein will produce the scallop shapes which results in a minor sawtooth profile along sidewalls of any resulting metal or dielectric structure. In some embodiments, after alternating cyclic deposition, some of all of the metal layers may be removed selective to the dielectric layers, or vices versa. In such cases, a wet etch or downstream non-direction plasma etch with low etch rate may be used to smooth out the sawtooth profile along sidewalls of any resulting metal or dielectric structure.

In at least one embodiment, selective deposition of first dielectric layer 106 is accomplished by thermal ALD or CVD using self-assembled monolayers to block metal surfaces against dielectric deposition. In an embodiment, selective deposition of first dielectric layer 106 can be performed with or without pretreatment of any adjacent or nearby metal surfaces.

The first dielectric layer 106 may include any dielectric material compatible with known selective deposition techniques, such as, but not limited to, the exemplary materials listed above. According to an embodiment, the first dielectric layer 106 may include the same or similar dielectric material as the underlying dielectric layer 102. In an alternative embodiment, the first dielectric layer 106 may include a different dielectric material as the underlying dielectric layer 102.

As previously described above, different dielectric materials can be used as enhancement layers such as etch stop layer, lower plasma induced damage, function as an oxidation and/or diffusion barrier, and increase breakdown voltage for improve device performance. The same or different materials may be specifically selected for reasons affecting fabrication. For example, similar materials may be used to facilitate good adhesion of subsequently deposited layers.

Figure 3:
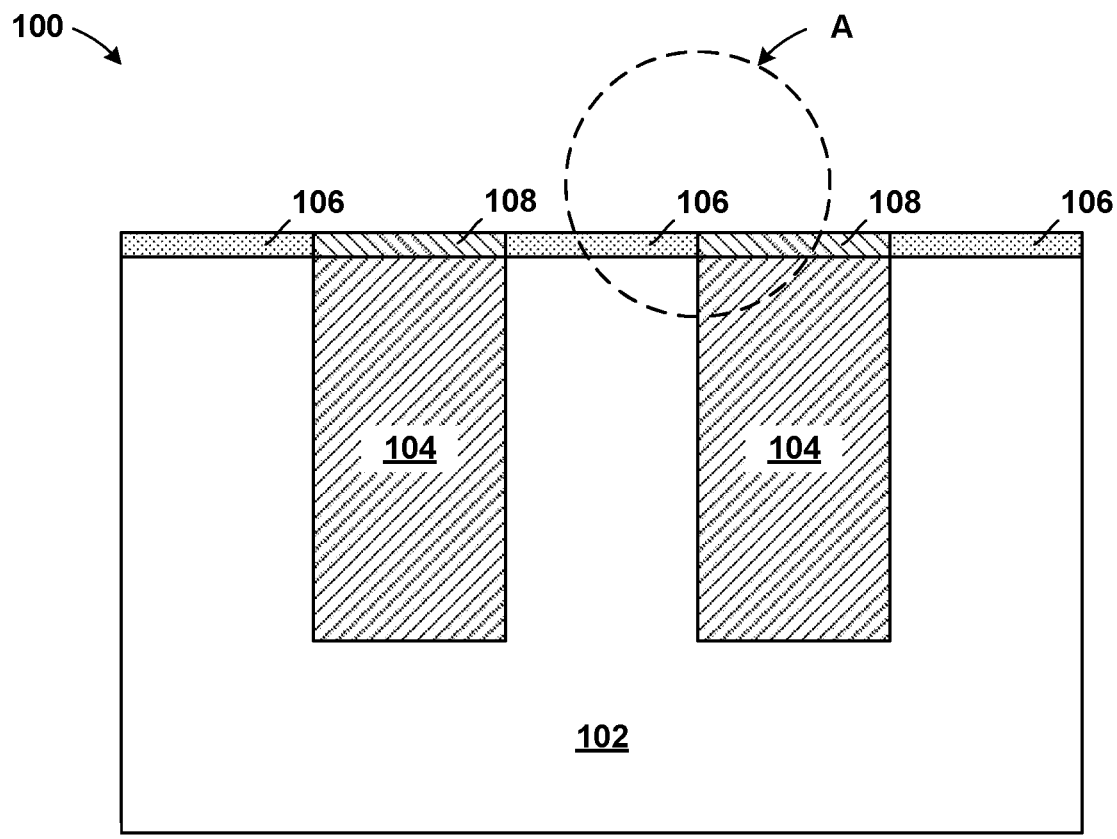
FIG. 3 is a cross-sectional view of the semiconductor structure illustrating after depositing a first metal layer according to an exemplary embodiment.
Figure 3A:
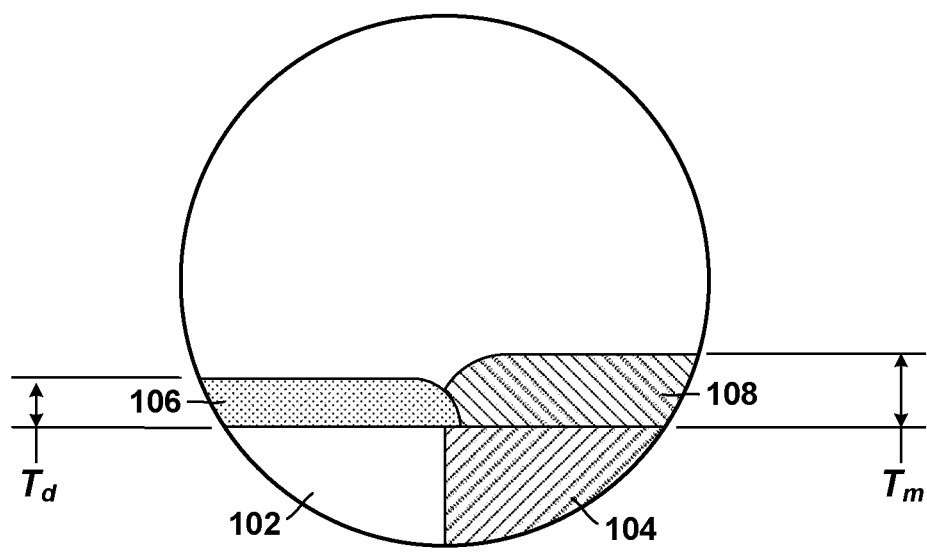
FIG. 3A depicts a section view, section A, of FIG. 3.

Referring to FIGS. 3 and 3A, a first metal layer 108 is selectively deposited on an upper surface of the metal regions 104. FIG. 3A is a section view, section A, of FIG. 3.

In general, the first metal layer 108 is selectively deposited on upper surfaces of the metal regions 104 without being deposited on adjacent surfaces of the dielectric layer 102 according to known techniques. As such, the first metal layer 108 will generally be self-aligned with exposed portions of the metal regions 104 and stop at the lateral edge of adjacent surfaces of the first dielectric layer 106, as illustrated. In practice, the previously deposited first dielectric layer 106 will stop, or prevent, lateral growth of the first metal layer 108; however, some lateral growth or lateral overlap is expected. In such cases, a small portion of the first metal layer 108 will extend laterally and overlap a small portion of the first dielectric layer 106 as generally shown in FIG. 3A.

The small portion of the first meal layer 108 overlapping the first dielectric layer 106 will also have a rounded or scalloped profile as shown in the figures. In all cases, the exact shape and size of the scalloped profiles will depend on the chosen selective deposition technique and individual layer thickness. For example, layers deposited with a smaller thickness will generally have a smaller scalloped profile and less overlap. Like above, for example, first meal layer 108 deposited at about 20-30 angstroms will laterally overlap the first dielectric layer 106 by about 2 nm or less.

A primary objective of using the techniques described herein is to optimize fabrication of nanostructures. Therefore, thinner layers are used to precisely control the shape and location of the final structure. Optionally, A non-directional wet or downstream plasma etch can also be used to smooth out the scalloped profile, as previously described above.

In at least one embodiment, selective deposition of the first metal layer 108 is accomplished by thermal ALD or CVD using a precursor and may use a suitable co-reactant such as a hydrogen or ammonia. In an embodiment, selective deposition of the first metal layer 108 can be performed with or without pretreatment of any adjacent or nearby dielectric surfaces.

The first metal layer 108 may include any metal compatible with known selective deposition techniques, such as, but not limited to, the exemplary materials listed above. According to an embodiment, the first metal layer 108 may include the same or similar metal as the underlying metal regions 104. Alternatively, in an embodiment, the first metal layer 108 may include a different metal as the underlying metal regions 104. As mentioned previously, using different metal layers can improve contact resistance, lower line resistance and improve electromigration properties of the resulting conductive structures by improving interfacial bonding with subsequent metal layers.

Like the first dielectric layer 106, the first metal layer 108 is also deposited in very thin films. For example, it is critical the first metal layer 108 be deposited with a thickness ($T_m$) less than 40 angstroms, and more preferably less than 30 angstroms, in order to limit the lateral overlap and fully appreciate the advantages of the present invention. The amount the first metal layer 108 will extend laterally and form on the first dielectric layer 106 decreases as the thickness of the first metal layer 108 decreases. Stated differently, selectively depositing a thinner metal layer (108) will limit or reduce how much the first metal layer 108 overlaps the first dielectric layer 106.

In the embodiment illustrated in FIGS. 3 and 3A, the first metal layer 108 will be deposited thicker than the first dielectric layer 106 to provide some level of control of the final feature shape and size. Doing so helps control positioning of the final structure as well as lateral growth of a subsequently deposited dielectric layer formed on top of the first dielectric layer 106. More specifically, the first metal layer 108 can be up to twice the thickness of the first dielectric layer 106; however, the precise thickness can be tuned or adjusted as necessary to control the shape and size of the final conductive feature.

Figure 4:
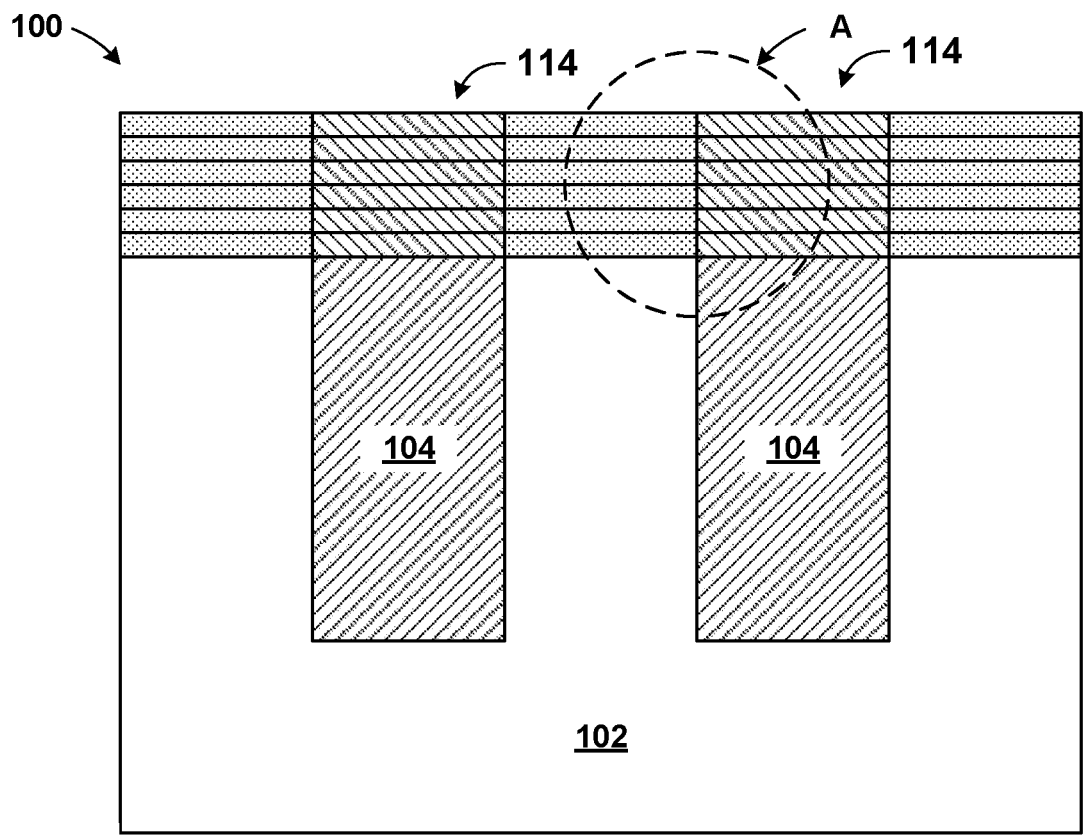
FIG. 4 is a cross-sectional view of a semiconductor structure illustrating after cyclically depositing additional dielectric layers and additional metal layers in an alternating fashion according to an exemplary embodiment.
Figure 4A:
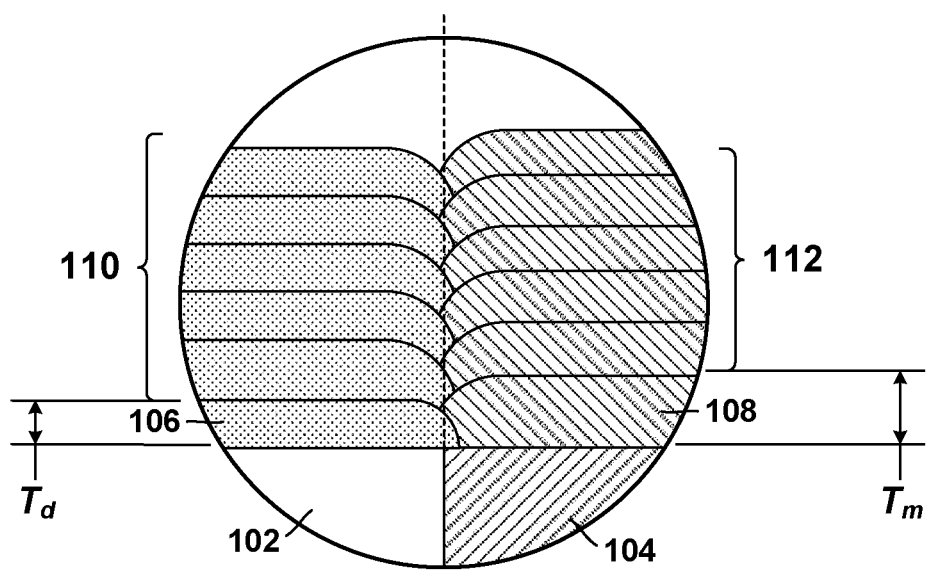
FIG. 4A depicts a section view, section A, of FIG. 4.

Referring to FIGS. 4 and 4A, additional dielectric layers 110 and additional metal layers 112 are cyclically deposited in an alternating fashion to form conductive features 114. FIG. 4A is a section view, section A, of FIG. 4.

Beginning with the structure of FIGS. 3 and 3A, the additional dielectric layers 110 and the additional metal layers 112 are selectively deposited one after another in an alternating or cyclical fashion. In the present example, deposition of the additional layers (110, 112) begins with selectively depositing an additional dielectric layer since the first metal layer 108 was immediately deposited last. It should be noted that lateral growth of each layer is generally controlled by the layer deposited immediately prior. For example, Alternating selective deposition of the additional layers (110, 112) continues until the conductive features 114 achieve a desired size or height. A height of the resulting conductive features 114 is controlled by adjusting the total number of layers deposited; however, the lateral width, and shape of the conductive features is controlled by adjusting the thickness of individual layers and the order in which they are deposited.

The additional dielectric layers 110 and the additional metal layers 112 are formed from similar materials, using similar techniques, at similar thickness as noted above with respect to the first dielectric layer 106 and the first metal layer 108. Alternatively, a variety of different materials may be used to produce or control specific properties as noted above. For example, the first dielectric layer 106 may be a different material from all of the additional dielectric layers 110, and similarly the first metal layer 108 may be a different material from all of the additional metal layers 112.

In the present example, the first dielectric layer 106 is deposited first with a thickness ($T_d$) less than a thickness ($T_m$) of the first metal layer 108. Furthermore, the additional dielectric layers 110 and the additional metal layers 112 each have a thickness equal, or substantially similar, to the thickness of the first metal layer 108. Stated differently, the first layer deposited is thinner than all subsequently deposited layers according to the present example. As such, the lateral width of each conductive feature 114 is substantially equal to, or slightly less than, the lateral width of each metal region 104, as illustrated in FIG. 4A.

As discussed previously, adjusting the thickness of the first dielectric layer 106 in the present embodiment will ultimately determine the lateral width of the resulting conductive features 114. For example, the overlap, or lateral extension, of the first dielectric layer 106 will increase as the thickness of the first dielectric layer 106 increases. Similarly, the overlap, or lateral extension, of the first dielectric layer 106 will decrease as the thickness of the first dielectric layer 106 decreases. Therefore, depositing a very thin first dielectric layer 106 provides precise control of the lateral width of the resulting conductive features (114). Controlling the lateral with of the resulting conductive features is ever more critical in the fabrication of nanostructures to prevent electrical shorts with neighboring structures.

Additionally, sidewalls of the conductive features 114 are substantially plum, or vertical, as a result of the uniform, or substantially equal, thicknesses of the additional dielectric layers 110 and the additional metal layers 112.

Finally, the cyclic deposition techniques described herein provide superior dimensional control over existing fabrication techniques, such as, typical single or dual damascene techniques which are prone to misalignment caused by limited lithography resolution for nano devices.

FIGS. 5-9 each illustrate a different alternative embodiment and demonstrate the functionality and unique control of the cyclical deposition techniques described herein above.

Figure 5:
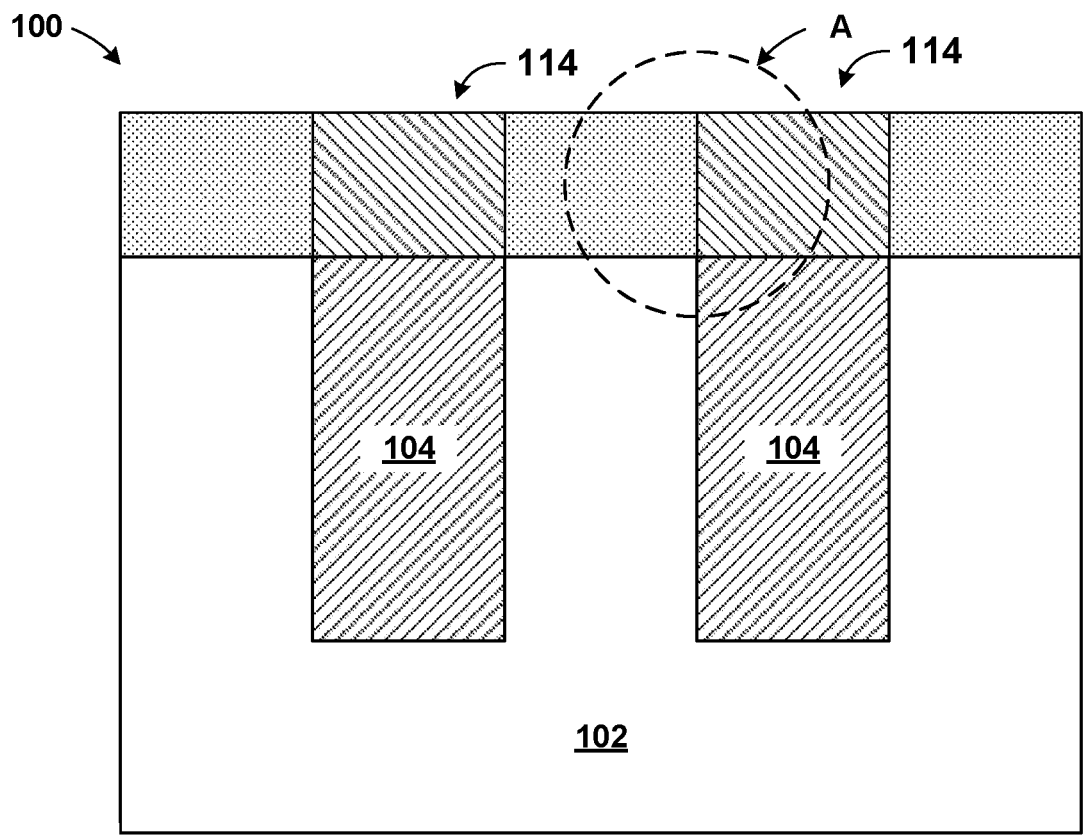
FIG. 5 is a cross-sectional view of the semiconductor structure illustrating after cyclically depositing dielectric layers and metal layers according to another exemplary embodiment.
Figure 5A:
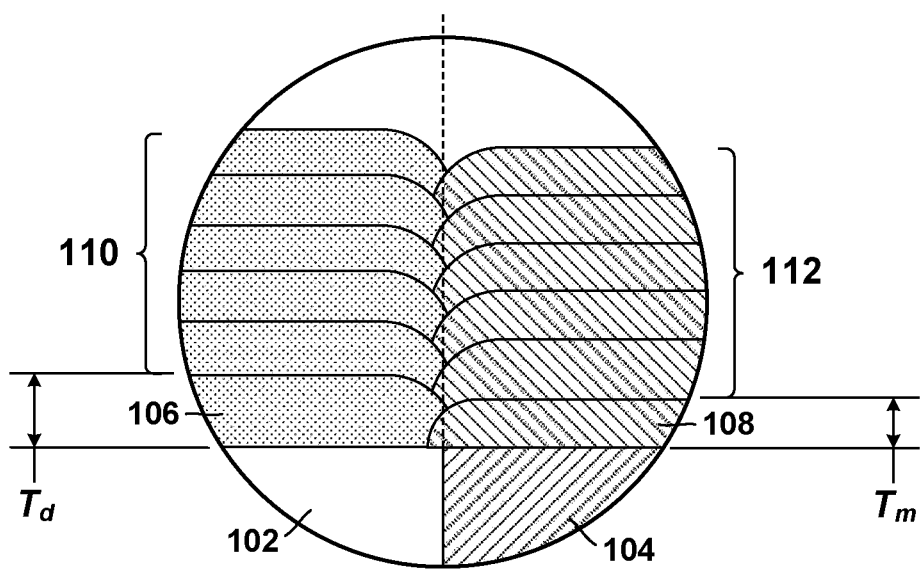
FIG. 5A depicts a section view, section A, of FIG. 5.

Referring to FIGS. 5 and 5A, the additional dielectric layers 110 and the additional metal layers 112 are cyclically deposited in an alternating fashion to form the conductive features 114. FIG. 5A is a section view, section A, of FIG. 5. Like above, the additional dielectric layers 110 and the additional metal layers 112 are selectively deposited one after another in an alternating or cyclical fashion; however, in a different order and with different layer thicknesses.

In the present example, the first metal layer 108 is deposited first with a thickness ($T_m$) less than a thickness ($T_d$) of the first dielectric layer 106. Furthermore, the additional dielectric layers 110 and the additional metal layers 112 each have a thickness equal, or substantially similar, to the thickness of the first dielectric layer 106. As such, the lateral width of each conductive feature 114 is substantially equal to, or slightly larger than, the lateral width of each metal region 104, as illustrated in FIG. 5A.

As discussed previously, adjusting the thickness of the first metal layer 108 in the present embodiment will ultimately determine the lateral width of the resulting conductive features 114. For example, the overlap, or lateral extension, of the first metal layer 108 will increase as the thickness of the first metal layer 108 increases. Similarly, the overlap, or lateral extension, of the first metal layer 108 will decrease as the thickness of the first metal layer 108 decreases. Therefore, depositing a very thin first metal layer 108 provides precise control of the lateral width of the resulting conductive features (114).

Additionally, like the example described above with respect to FIGS. 4 and 4A, sidewalls of the conductive features 114 are substantially plum, or vertical, as a result of the uniform, or substantially equal, thicknesses of the additional dielectric layers 110 and the additional metal layers 112.

Figure 6:
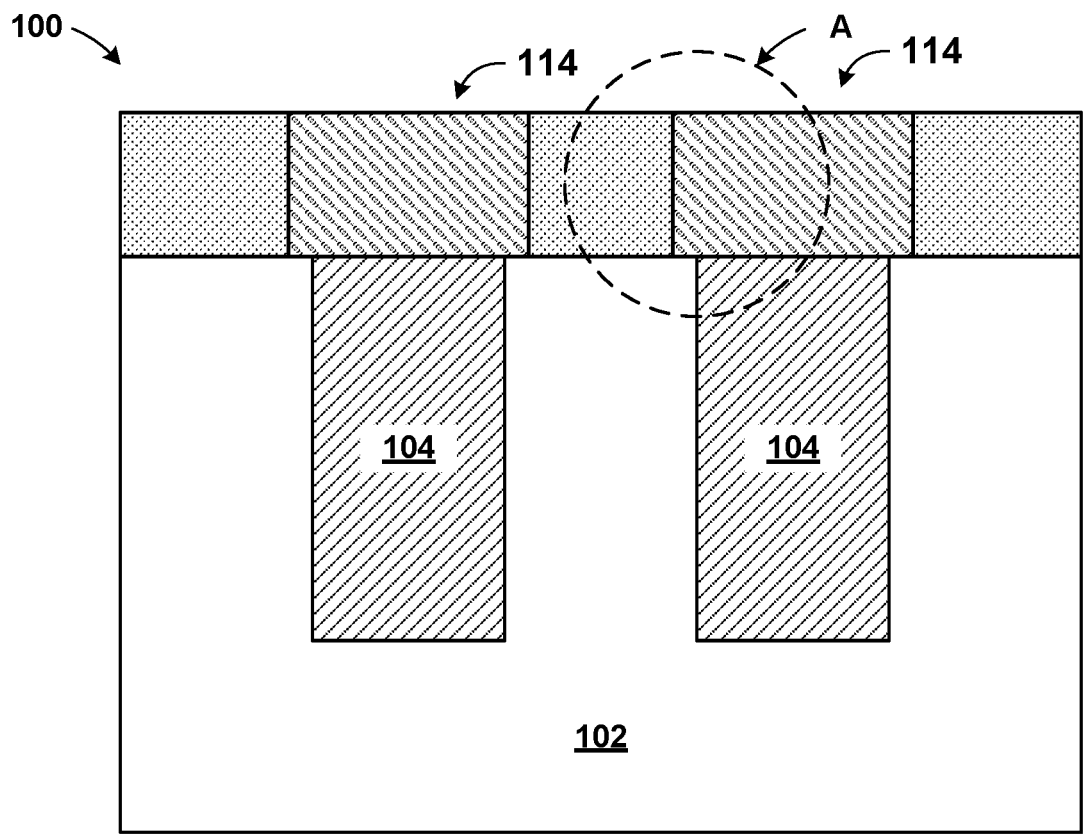
FIG. 6 is a cross-sectional view of the semiconductor structure illustrating after cyclically depositing dielectric layers and metal layers according to another exemplary embodiment.
Figure 6A:
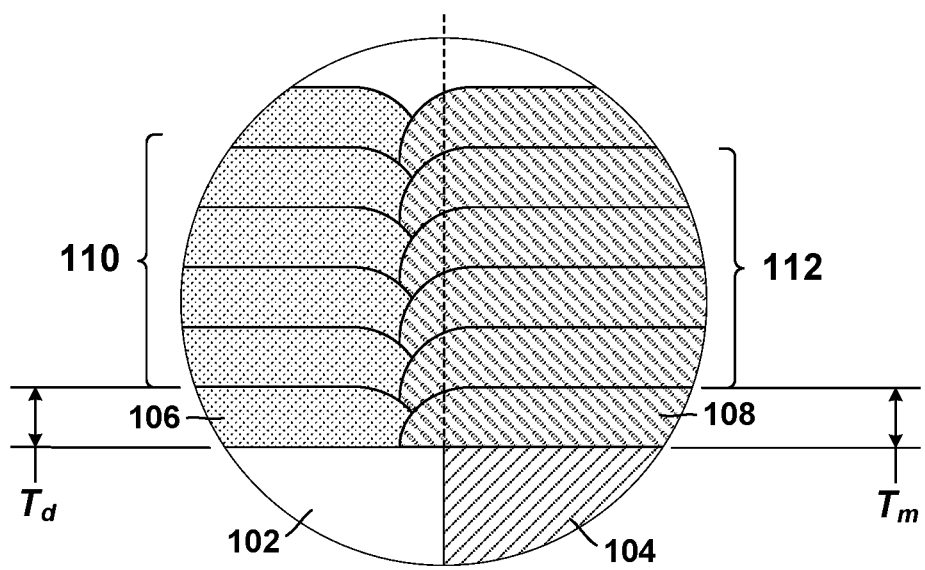
FIG. 6A depicts a section view, section A, of FIG. 6.

Referring to FIGS. 6 and 6A, the additional dielectric layers 110 and the additional metal layers 112 are cyclically deposited in an alternating fashion to form the conductive features 114. FIG. 6A is a section view, section A, of FIG. 6. Like above, the additional dielectric layers 110 and the additional metal layers 112 are selectively deposited one after another in an alternating or cyclical fashion; however, in a different order and with different layer thicknesses.

In the present example, the first metal layer 108 is deposited first with a thickness ($T_m$) equal to a thickness of all subsequently deposited layers, including the first dielectric layer 106. Furthermore, the additional dielectric layers 110 and the additional metal layers 112 each have a thickness equal, or substantially similar, to the thickness of both the first metal layer 108 and the first dielectric layer 106. Stated differently, all layers of the present embodiment are designed and deposited with equal thicknesses. As such, the lateral width of each conductive feature 114 of the present embodiment will be greater than the lateral width of each metal region 104, as illustrated in FIG. 6A.

As discussed previously, adjusting the thickness of the first metal layer 108 in the present embodiment will ultimately determine the lateral width of the resulting conductive features 114. For example, in the present embodiment, depositing a thicker first layer, here the first metal layer 108, will result in a larger overlap, or lateral extension, of and thereby cause the resulting conductive features 114 to be larger, or wider, than the metal regions 104.

Additionally, like the example described above with respect to FIGS. 4 and 4A, sidewalls of the conductive features 114 are substantially plum, or vertical, as a result of the uniform, or substantially equal, thicknesses of the additional dielectric layers 110 and the additional metal layers 112.

Figure 7:
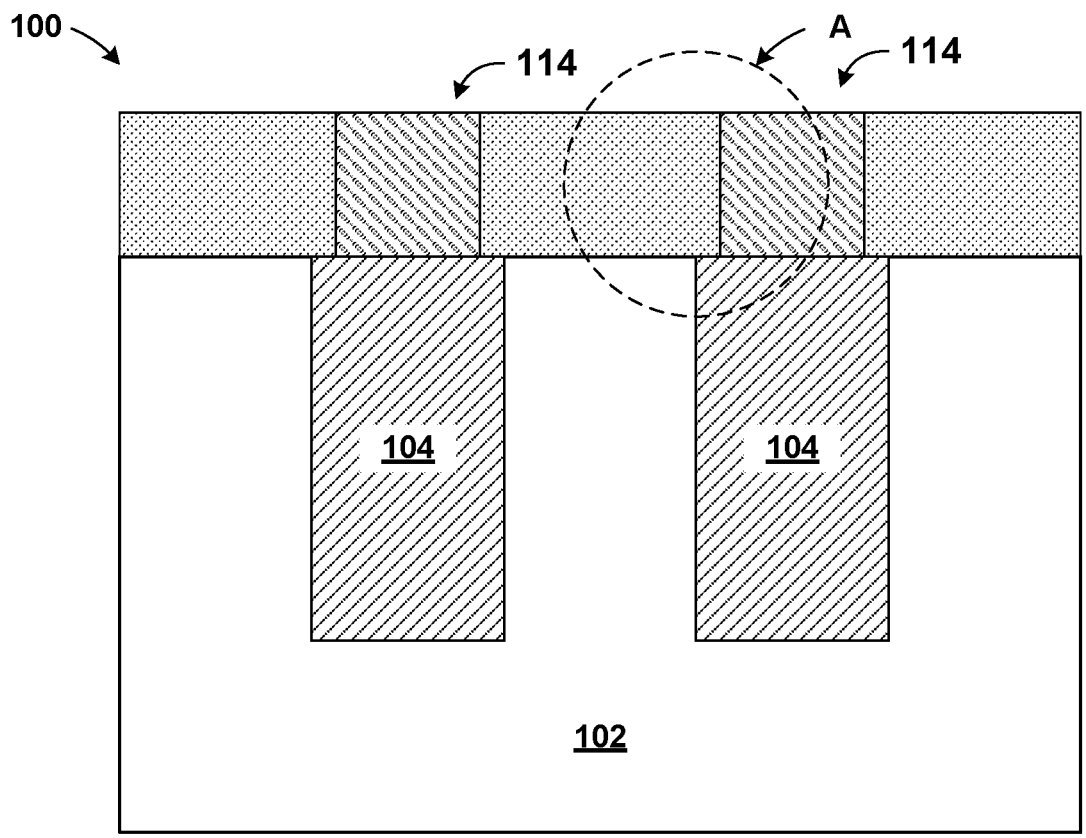
FIG. 7 is a cross-sectional view of the semiconductor structure illustrating after cyclically depositing dielectric layers and metal layers according to another exemplary embodiment.
Figure 7A:
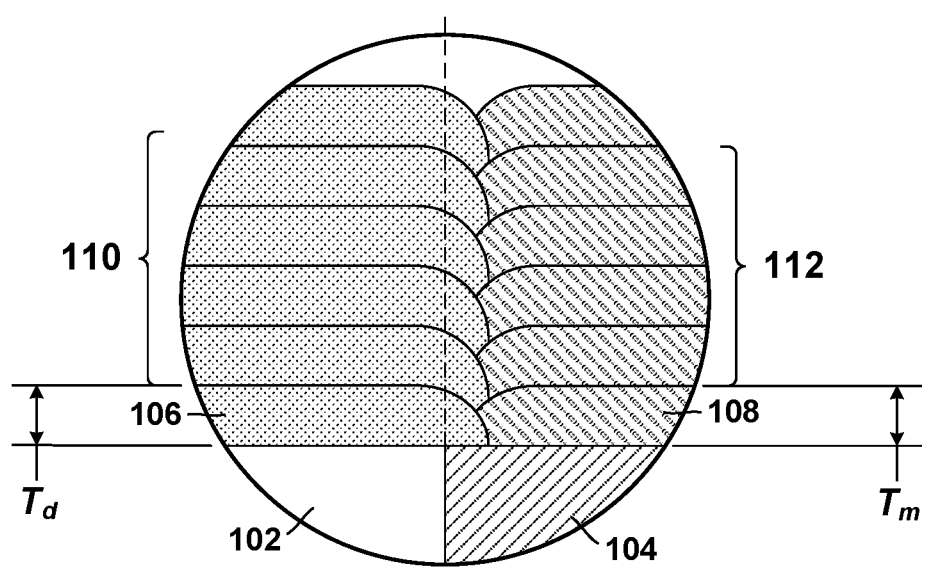
FIG. 7A depicts a section view, section A, of FIG. 7.

Referring to FIGS. 7 and 7A, the additional dielectric layers 110 and the additional metal layers 112 are cyclically deposited in an alternating fashion to form the conductive features 114. FIG. 7A is a section view, section A, of FIG. 7. Like above, the additional dielectric layers 110 and the additional metal layers 112 are selectively deposited one after another in an alternating or cyclical fashion; however, in a different order and with different layer thicknesses.

In the present example, the first dielectric layer 106 is deposited first with a thickness ($T_d$) equal to a thickness of all layers subsequently deposited, including the first metal layer 108. Furthermore, the additional dielectric layers 110 and the additional metal layers 112 each have a thickness equal, or substantially similar, to the thickness of both the first dielectric layer 106 and the first metal layer 108. Stated differently, all layers of the present embodiment are designed and deposited with equal thicknesses. As such, the lateral width of each conductive feature 114 of the present embodiment will be less than the lateral width of each metal region 104, as illustrated in FIG. 7A.

As discussed previously, adjusting the thickness of the first dielectric layer 106 in the present embodiment will ultimately determine the lateral width of the resulting conductive features 114. For example, in the present embodiment, depositing a thicker first layer, here the first dielectric layer 106, will result in a larger overlap, or lateral extension, of and thereby cause the resulting conductive features 114 to be smaller, or narrower, than the metal regions 104.

Additionally, like the example described above with respect to FIGS. 4 and 4A, sidewalls of the conductive features 114 are substantially plum, or vertical, as a result of the uniform, or substantially equal, thicknesses of the additional dielectric layers 110 and the additional metal layers 112.

Figure 8:
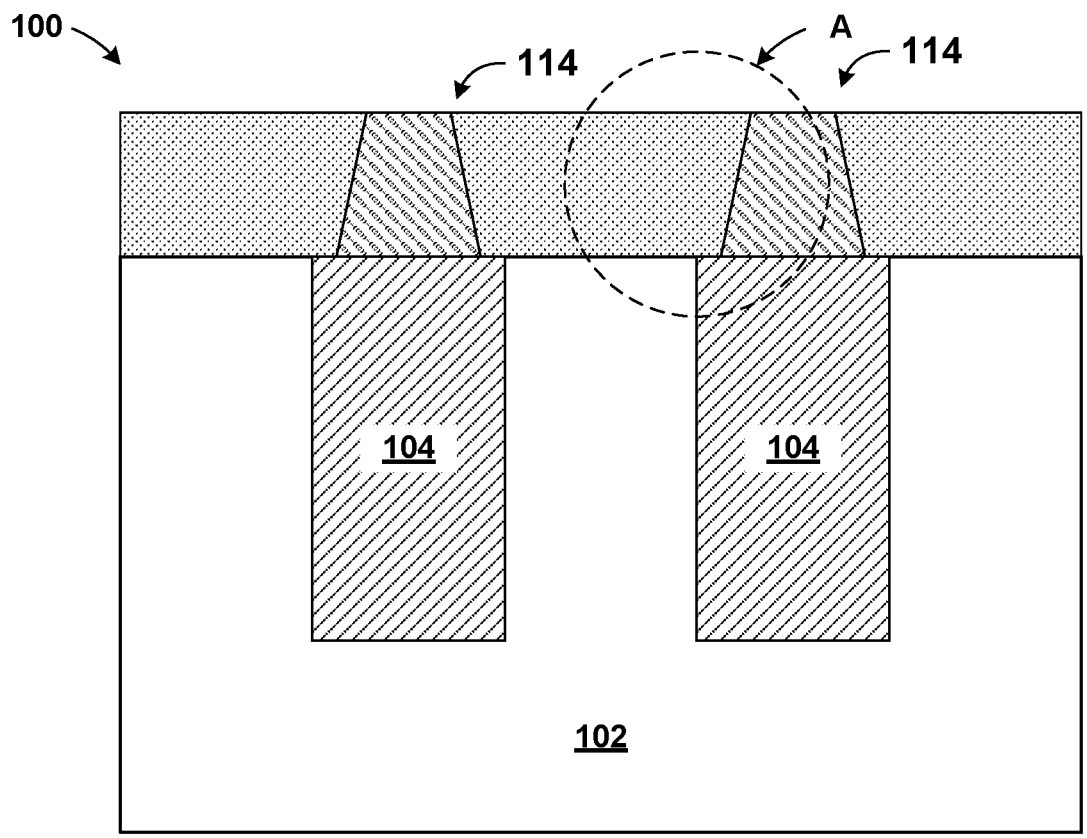
FIG. 8 is a cross-sectional view of the semiconductor structure illustrating after cyclically depositing dielectric layers and metal layers according to another exemplary embodiment.
Figure 8A:
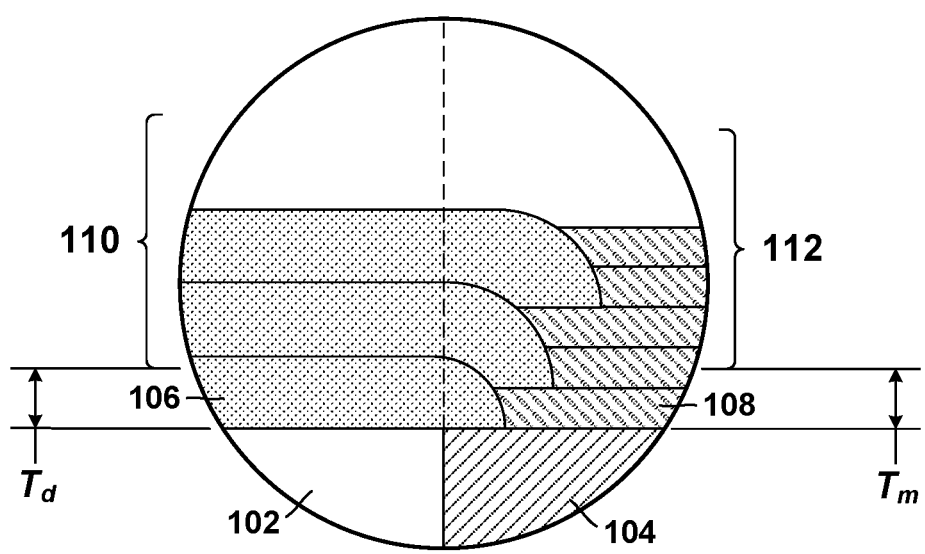
FIG. 8A depicts a section view, section A, of FIG. 8.

Referring to FIGS. 8 and 8A, the additional dielectric layers 110 and the additional metal layers 112 are cyclically deposited in an alternating fashion to form the conductive features 114. FIG. 8A is a section view, section A, of FIG. 8. Like above, the additional dielectric layers 110 and the additional metal layers 112 are selectively deposited one after another in an alternating or cyclical fashion; however, in a different order and with different layer thicknesses.

In the present example, the first dielectric layer 106 is deposited first with a thickness ($T_d$) greater than a thickness ($T_m$) of the first metal layer 108. Furthermore, the additional dielectric layers 110 are all deposited with a thickness equal to a thickness ($T_d$) of the first dielectric layer 106, and the additional metal layers 112 are all deposited with a thickness equal to a thickness ($T_m$) of the first metal layer 108. Stated differently, all dielectric layers (106, 110) are thicker than all metal layers (108, 112). As such, the lateral width of each conductive feature 114 decreases relative to its height, as illustrated in FIG. 8A. It should be noted that conductive features with a similar shape may also be achieved by starting the cyclic deposition with the first metal layer 108. It should be noted that despite variations in layer thickness each layer is still cyclically deposited in an alternating fashion.

According to the present embodiment, adjusting the thickness of the dielectric layers (106, 110) relative to the metal layers (108, 112) will ultimately determine the final shape of the resulting conductive features 114. For example, in the present embodiment, depositing thicker dielectric layers (106, 110) will result in the final conductive features 114 having a trapezoid shape. The exact shape of the final conductive features 114 can be controlled by adjusting layer thickness and number of deposited layers, while the size the final conductive features 114 can be controlled by adjusting the thickness of the first layer as previously described above. Unlike the examples described above, sidewalls of the conductive features 114 shown in FIGS. 8 and 8A will not be substantially plum, or vertical, but instead have some angle relative to the planar surfaces of the deposited layers.

Figure 9:
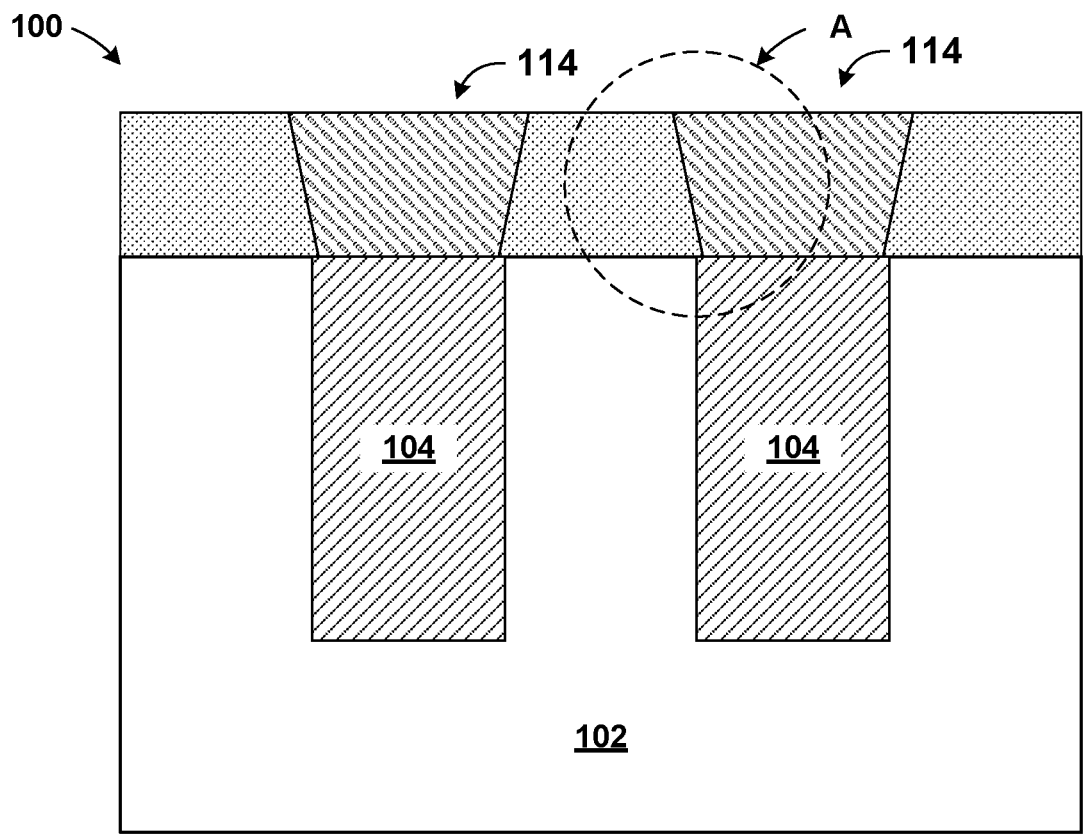
FIG. 9 is a cross-sectional view of the semiconductor structure illustrating after cyclically depositing dielectric layers and metal layers according to another exemplary embodiment.
Figure 9A:
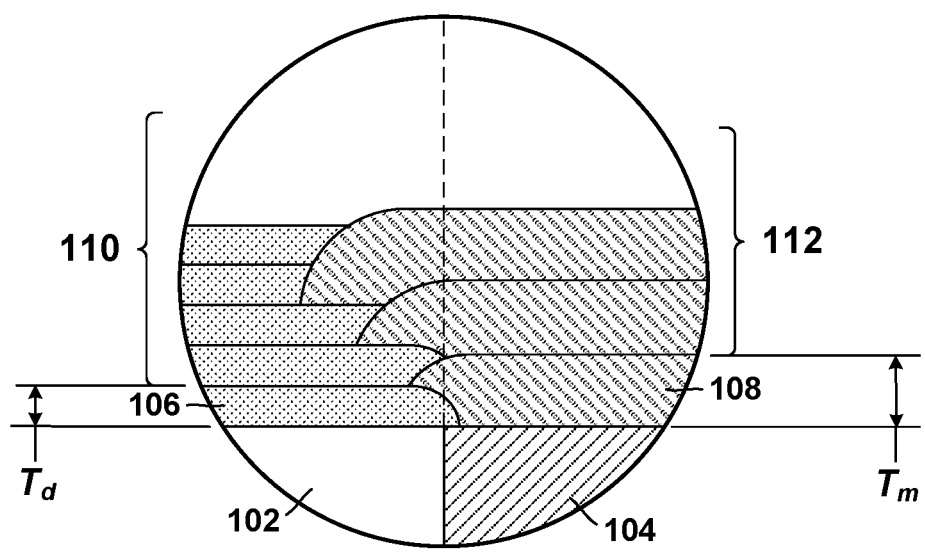
FIG. 9A depicts a section view, section A, of FIG. 9.

Referring to FIGS. 9 and 9A, the additional dielectric layers 110 and the additional metal layers 112 are cyclically deposited in an alternating fashion to form the conductive features 114. FIG. 9A is a section view, section A, of FIG. 9. Like above, the additional dielectric layers 110 and the additional metal layers 112 are selectively deposited one after another in an alternating or cyclical fashion; however, in a different order and with different layer thicknesses.

In the present example, the first dielectric layer 106 is deposited first with a thickness ($T_d$) less than a thickness ($T_m$) of the first metal layer 108. Furthermore, the additional dielectric layers 110 are all deposited with a thickness equal to a thickness ($T_d$) of the first dielectric layer 106, and the additional metal layers 112 are all deposited with a thickness equal to a thickness ($T_m$) of the first metal layer 108. Stated differently, all dielectric layers (106, 110) are thinner than all metal layers (108, 112). As such, the lateral width of each conductive feature 114 increases relative to its height, as illustrated in FIG. 9A. It should be noted that conductive features with a similar shape may also be achieved by starting the cyclic deposition with the first metal layer 108. It should be noted that despite variations in layer thickness each layer is still cyclically deposited in an alternating fashion.

According to the present embodiment, adjusting the thickness of the metal layers (108, 112) relative to the dielectric layers (106, 110) will ultimately determine the final shape of the resulting conductive features 114. For example, in the present embodiment, depositing thicker metal layers (108, 112) will result in the final conductive features 114 having a trapezium shape, or upside-down trapezoid. The exact shape of the final conductive features 114 can be controlled by adjusting layer thickness and number of deposited layers, while the size the final conductive features 114 can be controlled by adjusting the thickness of the first layer as previously described above. Unlike the examples described above, sidewalls of the conductive features 114 shown in FIGS. 9 and 9A will not be substantially plum, or vertical, but instead have some angle relative to the planar surfaces of the deposited layers.

It is generally understood by persons having ordinary skill in the art that a very specific conductive feature size and shape can be achieved by adjusting the order and thicknesses of the various dielectric and metal layers cyclically deposited in an alternating fashion. As detailed above, embodiments of the present invention enable the fabrication of conductive features (114) with very specific shapes and sizes. Specifically, each fabrication technique described above may be used alone or in combination to achieve a desired shape and size of the resulting conductive feature. The embodiments of the present invention, alone or in combination, therefore provide precise control of the lateral width, side wall angle, and dielectric/metal boundaries of the conductive features 114.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first dielectric layer comprising a first conductive metal feature embedded in the first dielectric layer;
   a second dielectric layer comprising a second conductive metal feature embedded in the second dielectric layer, wherein the second dielectric layer comprises a uniform composition throughout, wherein the second conductive metal feature is above and directly contacts the first conductive metal feature, wherein a sidewall of the second dielectric layer comprises a first repeating series of convex curves, and wherein a sidewall of the second conductive metal feature comprises a second repeating series of convex curves; and
   an interface between the second conductive metal feature and the second dielectric layer is where the first repeating series of convex curves contact the second repeating series of convex curves.

2. The semiconductor structure according to claim 1, wherein the second conductive metal feature is self-aligned with the first conductive metal feature.

3. The semiconductor structure according to claim 1, wherein the second conductive metal feature comprises substantially vertical sidewalls and a lateral width less than a lateral width of the first conductive metal feature embedded in the first dielectric layer.

4. The semiconductor structure according to claim 1, wherein the second conductive metal feature comprises substantially vertical sidewalls and a lateral width greater than a lateral width of the first conductive metal feature embedded in the first dielectric layer.

5. The semiconductor structure according to claim 1, wherein a lateral width of a top surface of the second conductive metal feature is less than a lateral width of a bottom surface of the second conductive metal feature.

6. The semiconductor structure according to claim 1, wherein a lateral width of a top surface of the second conductive metal feature is greater than a lateral width of a bottom surface of the second conductive metal feature.

7. A semiconductor structure comprising:
   a metal nanostructure embedded in a dielectric layer having a uniform composition throughout, wherein a sidewall of the metal nanostructure comprises a series of concave curves, wherein a sidewall of the dielectric layer comprises a series of convex curves; and wherein a boundary between the metal nanostructure and the dielectric layer is where the series of concave curves contact the series of convex curves.

8. The semiconductor structure according to claim 7, wherein the metal nanostructure is self-aligned with an underlying metal region.

9. The semiconductor structure according to claim 7, wherein the metal nanostructure comprises a lateral width less than a lateral width of an underlying metal region.

10. The semiconductor structure according to claim 7, wherein individual curves of the series of concave curves complement individual curves of the series of convex curves.

11. The semiconductor structure according to claim 7, wherein a lateral width of a top surface of the metal nanostructure is less than a lateral width of a bottom surface of the metal nanostructure.

12. The semiconductor structure according to claim 7, wherein individual curves of the series of concave curves substantially match individual curves of the series of convex curves.

13. A semiconductor structure comprising:
    a conductive nanostructure embedded in a dielectric layer having a uniform composition throughout, wherein a sidewall of the conductive nanostructure comprises a first series of convex and concave curves, wherein a sidewall of the dielectric layer comprises a second series of convex and concave curves; and wherein an interface between the conductive nanostructure and the dielectric layer is where the first series of convex and concave curves contact the second series of convex and concave curves.

14. The semiconductor structure according to claim 13, wherein the conductive nanostructure is self-aligned with an underlying metal region.

15. The semiconductor structure according to claim 13, wherein the conductive nanostructure comprises a lateral width greater than a lateral width of an underlying metal region.

16. The semiconductor structure according to claim 13, wherein individual curves of the first series of convex curves and concave curves complement individual curves of the second series of convex curves and concave curves.

17. The semiconductor structure according to claim 13, wherein individual curves of the first series of convex curves and concave curves substantially match individual curves of the second series of convex curves and concave curves.

18. The semiconductor structure according to claim 13, wherein a lateral width of a top surface of the conductive nanostructure is greater than a lateral width of a bottom surface of the conductive nanostructure.

19. The semiconductor structure according to claim 13, wherein the conductive nanostructure comprises multiple thin film layers made from at least two different materials.

* * * * *